United States Patent
Lin et al.

(10) Patent No.: US 12,363,862 B2
(45) Date of Patent: Jul. 15, 2025

(54) TWO-PHASE IMMERSION COOLING SYSTEM, WORKING FLUID RECOVERY DEVICE AND METHOD

(71) Applicant: DELTA ELECTRONICS, INC., Taoyuan (TW)

(72) Inventors: Wei-Chih Lin, Taoyuan (TW); Ren-Chun Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 243 days.

(21) Appl. No.: 18/334,398

(22) Filed: Jun. 14, 2023

(65) Prior Publication Data
US 2024/0081023 A1    Mar. 7, 2024

Related U.S. Application Data

(60) Provisional application No. 63/374,745, filed on Sep. 6, 2022.

(30) Foreign Application Priority Data

Mar. 24, 2023  (CN) .......................... 202310296560.5

(51) Int. Cl.
*H05K 7/20* (2006.01)
(52) U.S. Cl.
CPC ......... *H05K 7/203* (2013.01); *H05K 7/20318* (2013.01); *H05K 7/20327* (2013.01)
(58) Field of Classification Search
CPC .................................................. H05K 7/203
See application file for complete search history.

(56) References Cited

U.S. PATENT DOCUMENTS

| | | | |
|---|---|---|---|
| 5,943,867 A | 8/1999 | Thomas et al. | |
| 6,205,796 B1 | 3/2001 | Chu et al. | |
| 10,863,650 B2 * | 12/2020 | Shen ................... | H05K 7/20354 |
| 11,105,545 B2 * | 8/2021 | Ma .......................... | F25B 45/00 |
| 11,399,449 B2 * | 7/2022 | Wong ................. | H05K 7/20781 |
| 2007/0193300 A1 * | 8/2007 | Tilton ..................... | F25B 43/04 |
| | | | 257/E23.088 |

(Continued)

FOREIGN PATENT DOCUMENTS

| CN | 113242679 B | 5/2022 |
|---|---|---|
| TW | 202110522 A | 3/2021 |

(Continued)

*Primary Examiner* — Robert J Hoffberg
(74) *Attorney, Agent, or Firm* — CKC & Partners Co., LLC

(57) ABSTRACT

A working fluid recovery device includes an air moving unit, a water removal unit, a working fluid recovery unit, a condenser, and a working fluid collection tank. The air moving unit is configured to suck in a mixed gas including a non-condensable gas, a steam and a vapor phase of working fluid. The water removal unit is connected to the air moving unit, and configured to remove the steam. The working fluid recovery unit is connected to the water removal unit, and configured to recover the vapor phase of the working fluid and exhaust the non-condensable gas. The condenser is connected to the working fluid recovery unit, and configured to condense the vapor phase of the working fluid into a liquid phase of the working fluid. The working fluid collection tank is connected to the condenser, and configured to store the liquid phase of the working fluid.

15 Claims, 3 Drawing Sheets

(56) References Cited

U.S. PATENT DOCUMENTS

| | | | |
|---|---|---|---|
| 2007/0193721 A1 | 8/2007 | Tilton et al. | |
| 2016/0025393 A1* | 1/2016 | Rockwell | F25B 45/00 62/195 |
| 2019/0113262 A1 | 4/2019 | Ma et al. | |
| 2021/0392776 A1* | 12/2021 | Tuma | H05K 7/20809 |
| 2021/0410320 A1 | 12/2021 | Yang et al. | |
| 2022/0159846 A1 | 5/2022 | Kim | |
| 2022/0232738 A1* | 7/2022 | Tuma | H05K 7/20381 |
| 2022/0264761 A1 | 8/2022 | Keehn et al. | |
| 2024/0057290 A1* | 2/2024 | Lin | H05K 7/20327 |
| 2024/0198252 A1* | 6/2024 | Oseen-Senda | H05K 7/20818 |

FOREIGN PATENT DOCUMENTS

| | | | | |
|---|---|---|---|---|
| TW | I747628 B | 11/2021 | | |
| TW | 202219682 A | 5/2022 | | |
| WO | 2022149045 A1 | 7/2022 | | |
| WO | WO-2024022606 A1 * | 2/2024 | | H05K 7/203 |

\* cited by examiner

TWO-PHASE IMMERSION COOLING SYSTEM, WORKING FLUID RECOVERY DEVICE AND METHOD

CROSS-REFERENCE TO RELATED APPLICATION

This application claims priority to U.S. Provisional Application Ser. No. 63/374,745 filed Sep. 6, 2022, and CN Application No. 202310296560.5, filed Mar. 24, 2023, the disclosures of which are incorporated herein by reference in their entireties.

BACKGROUND

Field of Invention

The present invention relates to a two-phase immersion cooling system, a working fluid recovery device, and a working fluid recovery method for working fluid recovery devices.

Description of Related Art

Large scale computer server systems can perform significant workloads and generate a large amount of heat during their operation. A significant portion of the heat is generated by the operation of these servers. Due in part to the large amount of heat generated, these servers are typically rack mounted and air-cooled via internal fans and/or fans attached to the back of the rack or elsewhere within the server ecosystem. As the need for access to greater and greater processing and storage resources continues to expand, the density of server systems (i.e., the amount of processing power and/or storage placed on a single server, the number of servers placed in a single rack, and/or the number of servers and or racks deployed on a single server farm), continue to increase. With the desire for increasing processing or storage density in these server systems, the thermal challenges that result remain a significant obstacle. The existing heat dissipation technology takes fans, water-cooled plate cooling, single-phase immersion cooling and two-phase immersion cooling as main solutions.

For the fan cooling method, its efficiency is too low for a high-power stand-alone machine, which may easily cause the apparatus to run at high temperature, and the fan cooling is easily affected by the external ambient temperature. For example, if the temperature is low in winter, the fan cooling may be able to meet the demand, but in summer the temperature is high and the fan cooling effect is limited, which cannot meet the cooling requirements of computing equipment. For the water-cooled plate heat dissipation method, the main medium is water, and the heat dissipation efficiency is higher than that of the fan, but there is a risk of corrosion, water condensation, or short circuit of the flow channel after long-term use of the water-cooled plate. Moreover, the water-cooled plate needs to be designed separately for different heat dissipation devices, which is not economical.

Therefore, immersion cooling is mainly used at present. In the single-phase immersion method, it is mainly divided into overflow type and under spray. In the overflow method, the cold flow enters from the bottom of the heat generating component, the heat rises with the liquid, and the hottest liquid at the top is pumped away into the refrigerator for external heat dissipation. This method has higher heat dissipation efficiency for dense radiators, but consumes more liquid, and all heat generating components need to be submerged in cooling liquid. In the under spray heat dissipation method, the cold flow is precisely sprayed on the bottom heat dissipation device from above. After heat exchange, the heat flow is drawn into the recovery pool by gravity to dissipate heat. This method can save coolant, but the heat dissipation efficiency for high-density heat dissipation devices is not high.

For two-phase immersion cooling, the coolant costs are high. Since the cooling liquid is a gas-liquid conversion, it requires extremely high sealing performance of the equipment. If the seal is not good, not only poor for the environmental protection, but the leakage of liquid caused by gaseous escape will lead to low economic efficiency of the whole system. In view of this, how to solve the escape and recovery of the gas phase of the coolant has become one of the current important research and development topics.

SUMMARY

The invention provides a working fluid recovery device for a two-phase immersion cooling system. The working fluid recovery device includes an air moving unit, a water removal unit, a working fluid recovery unit, a condenser and a working fluid collection tank. The air moving unit is configured to suck in a mixed gas including a non-condensable gas, a steam and a vapor phase of working fluid. The water removal unit is connected to the air moving unit, and configured to remove the steam. The working fluid recovery unit is connected to the water removal unit, and configured to recover the vapor phase of the working fluid and exhaust the non-condensable gas. The condenser is connected to the working fluid recovery unit, and configured to condense the vapor phase of the working fluid into a liquid phase of the working fluid. The working fluid collection tank is connected to the condenser, and configured to store the liquid phase of the working fluid.

The present disclosure provides a two-phase immersion cooling system. The two-phase immersion cooling system includes a cooling tank, an upper lid, a closed enclosure, and a working fluid recovery device. The cooling tank is used to accommodate a working fluid, a heat generating component and a second condenser, in which when a liquid phase of the working fluid receives heat from the heat generating component and undergoes phase inversion into a vapor phase, and the vapor phase is condensed back to the liquid phase through the second condenser. The upper lid is disposed on a top of the cooling tank. The closed enclosure is disposed above the cooling tank, in which when the upper lid is opened, the cooling tank communicates with the closed enclosure, and a portion of the vapor phase of the working fluid escapes into the closed enclosure. The working fluid recovery device is disposed outside of the cooling tank and the closed enclosure and communicated with the cooling tank and the closed enclosure, and the working fluid recovery device is used to recover the vapor phase of the working fluid escaping into the closed enclosure.

The present disclosure further provides a working fluid recovery method used in the above-mentioned working fluid recovery device. The method includes the following steps. A first mixed gas including a non-condensable gas, a steam and a vapor phase of a working fluid flows into a water removal unit by an air moving unit. The steam is adsorbed by the water removal unit and a second mixed gas including the non-condensable gas and the vapor phase of the working fluid flows into a working fluid recovery unit. The vapor phase of the working fluid is adsorbed and the non-condensable gas is exhausted by the working fluid recovery unit. The vapor phase of the working fluid is condensed back into a liquid phase of the working fluid by the first condenser and the liquid phase of the working fluid is stored in a working fluid collection tank.

The two-phase immersion cooling system, the working fluid recovery device and the working fluid recovery method of the present disclosure may respectively realize the gas recovery of the cooling tank and the closed enclosure of the two-phase immersion cooling system. The advantages of the present disclosure are that: (1) the working fluid is recovered from the cooling tank and the non-condensable gas and the steam are exhausted to outside, which can improve the circulation efficiency of the working fluid; (2) recycling the gas phase of the working fluid from the closed enclosure may reduce the cost of the gas phase loss of the working fluid and reduce the emission of greenhouse gases.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
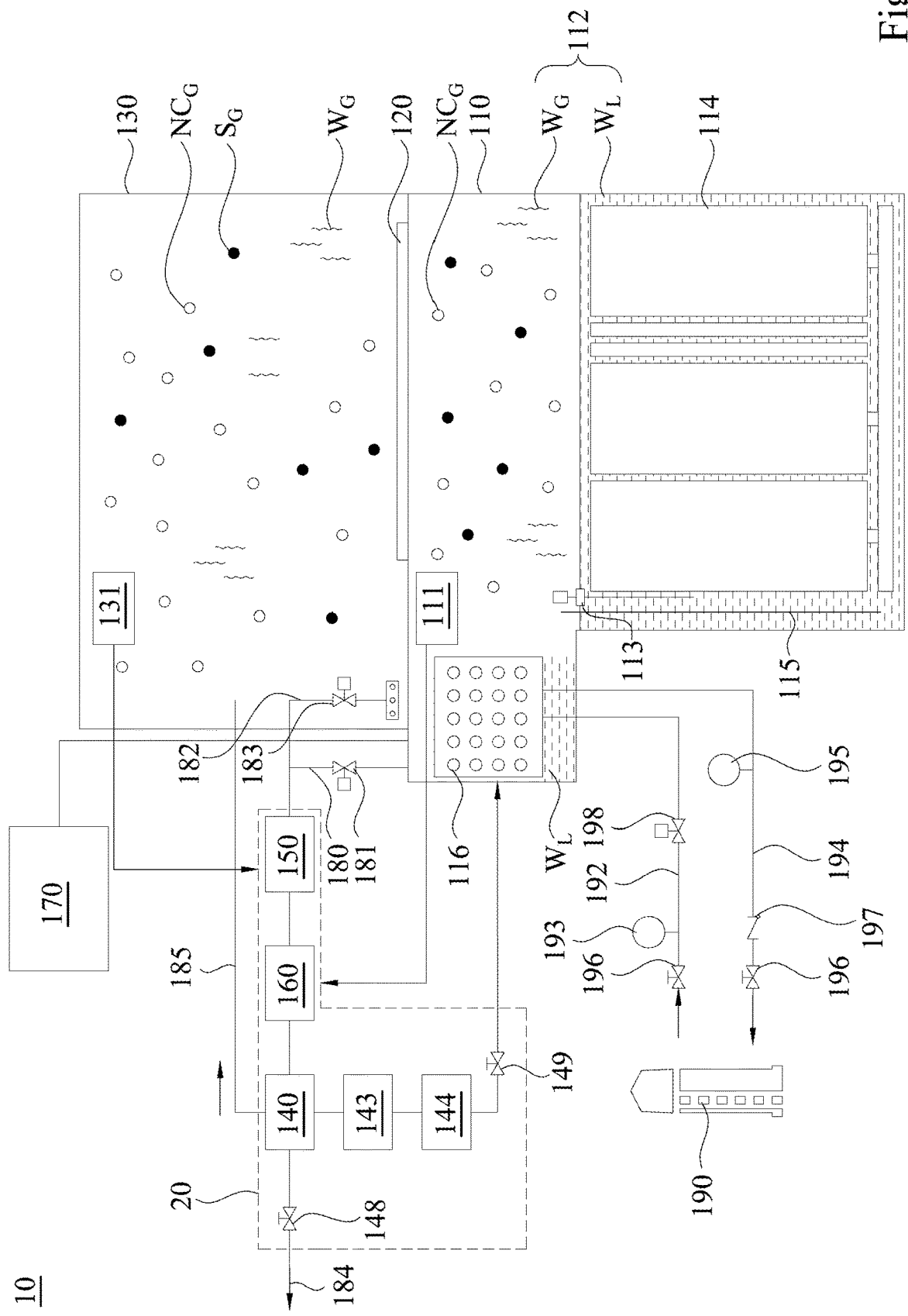
FIG. 1 shows a schematic diagram of a two-phase immersion cooling system according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Two-phase immersion cooling is an emerging cooling technology for the high-performance server computing market which relies on the heat absorbed in the process of vaporizing a liquid (the cooling fluid) to a gas (i.e., the heat of vaporization). The working fluids, i.e. a coolant or a refrigerant, used in this application must meet certain requirements to be viable in the application. For example, the boiling temperature during operation should be in a range between for example 30° C.-75° C. Generally, this range accommodates maintaining the server components at a sufficiently cool temperature while allowing heat to be dissipated efficiently to an ultimate heat sink (e.g., outside air). The working fluid must be inert so that it is compatible with the materials of construction and the electrical components. Certain perfluorinated and partially fluorinated materials meet these requirements.

In a typical two-phase immersion cooling system, servers are submerged in a bath of working fluid (having a boiling temperature) that is sealed and maintained at or near atmospheric pressure. A condenser integrated into the tank is cooled by water at a certain temperature ($T_w$). During operation, after steady reflux is established, the working fluid vapor (gas phase) generated by the boiling working fluid forms a discrete vapor level as it is condensed back into the liquid state. Above this layer is the "headspace," a mixture of a non-condensable gas (typically air and steam) and the working fluid vapor which is at a temperature somewhere between $T_w$ and the temperature ($T_{amb}$) of ambient air outside the tank. These three components (liquid phase, vapor phase, and mixture) occupy volumes within the tank.

During normal operation of two-phase immersion cooling systems, the "headspace" phase must be occasionally vented. Such venting results in loss of working fluid vapor which is an undesirable operating cost. In addition, since most of the working fluid is fluoride, the vapor phase of the working fluid exhausted to the outside will be regarded as a greenhouse gas, which does not comply with the global warming potential (GWP) specification.

As used herein, "fluid" means a liquid phase and/or a vapor phase. As used herein, "fluoro-" (for example, in reference to a group or moiety, such as in the case of "fluoroalkylene" or "fluoroalkyl" or "fluorocarbon") or "fluorinated" means (i) partially fluorinated such that there is at least one carbon-bonded hydrogen atom, or (ii) perfluorinated. As used herein, "perfluoro-" (for example, in reference to a group or moiety, such as in the case of "perfluoroalkylene" or "perfluoroalkyl" or "perfluorocarbon") or "perfluorinated" means completely fluorinated such that, except as may be otherwise indicated, any carbon-bonded hydrogens are replaced by fluorine atoms. As used herein, "halogenated material" means an organic compound that is at least partially halogenated (up to completely halogenated) such that there is at least one carbon-bonded halogen atom.

The present disclosure provides a two-phase immersion cooling system, which can not only recover the vapor phase of the working fluid to reduce the maintenance cost of the system, but also reduce the emission of greenhouse gases (the vapor phase of the working fluid). FIG. 1 shows a schematic configuration diagram of a two-phase immersion cooling system 10 according to an embodiment of the present disclosure. It should be noted that the direction of the arrow in the figure is the flow direction of the medium (liquid phase or vapor phase).

As shown in FIG. 1, the two-phase immersion cooling system 10 includes a cooling tank 110, an upper lid 120, a closed enclosure 130, and a working fluid recovery device 20. The cooling tank 110 is used to accommodate a working fluid 112, a heat generating component 114, and a condenser 116. More specifically, the working fluid 112 fills the entire cooling tank 110. The liquid phase of the working fluid $W_L$ is located in the lower volume within the cooling tank 110, and the vapor phase of the working fluid $W_G$ is located in the upper volume within the cooling tank 110. The heat generating component 114 is disposed inside the cooling tank 110 and located in the lower volume within the cooling tank 110. The heat generating component 114 is completely immersed in the liquid phase of the working fluid $W_L$. In other embodiments, the heat generating component 114 may be at least partially immersed in the liquid phase of the working fluid $W_L$. In some embodiments, the heat generating component 114 may include one or more electronic devices, such as computing servers.

The condenser 116 is disposed in the cooling tank 110 and located in the upper volume within the cooling tank 110. The condenser 116 shown in FIG. 1 is only an illustration. In practice, the condenser 116 is, for example, a plurality of bare metal pipelines, and these metal pipelines are filled with flowing water at room temperature. During the stable operation of the two-phase immersion cooling system 10, the liquid phase of the working fluid $W_L$ absorbs the heat of the heat generating component 114 and converts into a vapor phase of the working fluid $W_G$, which rises to the upper volume of the cooling tank 110. Then, the vapor phase of the working fluid $W_G$ contacts the low-temperature condenser 116 to condense back to the liquid phase of the working fluid $W_L$ and falls, thereby returning to the lower volume of the cooling tank 110.

In some embodiments, the cooling tank 110 further includes a manometer 111, which is used to detect a pressure of the vapor phase of the working fluid $W_G$ in the cooling tank 110. For example, when the pressure within the cooling tank 110 is higher than a certain setting threshold, the valve 181 would open and release a portion of the vapor phase of the working fluid $W_G$ so as to maintain the pressure in the cooling tank 110. In some embodiments, a liquid level detector 113 may also be disposed in the cooling tank 110 to detect whether the amount of liquid phase of the working fluid $W_L$ is sufficient.

In some embodiments, the working fluid 112 may be or include one or more halogenated fluids (e.g., fluorinated or chlorinated). For example, the working fluid 112 may be a fluorinated organic fluid. Suitable fluorinated organic fluids may include hydrofluoroethers, fluoroketones (or perfluoroketones), hydrofluoroolefins, perfluorocarbons (e.g., perfluorohexane), perfluoromethyl morpholine, or combinations thereof.

In some embodiments, the working fluid 112 may include (individually or in any combination): ethers, alkanes, perfluoroalkenes, alkenes, haloalkenes, perfluorocarbons, perfluorinated tertiary amines, perfluoroethers, cycloalkanes, esters, perfluoroketones, ketones, oxiranes, aromatics, siloxanes, hydrochlorocarbons, hydrochlorofluorocarbons, hydrofluorocarbons, hydrofluoroolefins, hydrochloroolefins, hydrochlorofluoroolefins, hydrofluoroethers, or mixtures thereof based on the total weight of the working fluid; or alkanes, perfluoroalkenes, haloalkenes, perfluorocarbons, perfluorinated tertiary amines, perfluoroethers, cycloalkanes, perfluoroketones, aromatics, siloxanes, hydrochlorocarbons, hydrochlorofluorocarbons, hydrofluorocarbons, hydrofluoroolefins, hydrochlorofluoroolefins, hydrofluoroethers, or mixtures thereof, based on the total weight of the working fluid. Such additional components can be chosen to modify or enhance the properties of a composition for a particular use.

Referring to FIG. 1, the upper lid 120 is disposed on a top of the cooling tank 110. The closed enclosure 130 is disposed above the cooling tank 110. When the upper lid 120 is opened, the cooling tank 110 communicates with the closed enclosure 130, and a portion of the vapor phase of the working fluid $W_G$ escapes into the closed enclosure 130. The working fluid recovery device 20 is disposed outside of the cooling tank 110 and the closed enclosure 130 and communicates with the cooling tank 110 and the closed enclosure 130. In some embodiments, a working fluid sensor 131 is further included in the closed enclosure 130, and the working fluid sensor 131 is used to detect a working fluid concentration in the closed enclosure 130. For example, when the working fluid concentration within the closed enclosure 130 is higher than a certain setting threshold, the valve 183 is opened and the working fluid recovery device 20 is turned on so as to carry out working fluid recovery.

It is noted that, when the two-phase immersion cooling system 10 is initially running, the upper volume of the cooling tank 110 may contain a small amount of non-condensable gas $NC_G$ due to ventilation. That is to say, at this time, the upper volume of the cooling tank 110 contains a mixed gas including a non-condensable gas $NC_G$ and the vapor phase of the working fluid $W_G$. However, the existence of the non-condensable gas $NC_G$ would cause the cooling performance of the condenser 116 to drop significantly. Therefore, the non-condensable gas $NC_G$ should be extracted during the initial operation of the two-phase immersion cooling system 10. However, when the non-condensable gas $NC_G$ is drawn out, a portion of the vapor phase of the working fluid $W_G$ would be exhausted and lost. Hence, the working fluid recovery device 20 in the two-phase immersion cooling system 10 of the present disclosure may be configured to recover the working fluid 112 in the mixed gas drawn out from the cooling tank 110 and exhaust the non-condensable gas $NC_G$ through a pipeline 184. More specifically, during initial operation, the valve 181 on the pipeline 180 would be opened to allow the mixed gas to flow out, and would be processed by the working fluid recovery device 20 to recover the working fluid 112, while the non-condensable gas $NC_G$ would be exhausted to the external environment. Of course, this is to exclude a portion of the non-condensable gas $NC_G$ existing in the cooling tank 110, thereby increasing the cooling performance of the condenser 116.

In some embodiments, a water baffle 115 may be further disposed in the lower volume within the cooling tank 110 and located between the condenser 116 and the heat generating component 114. The water baffle 115 is used to separate the cooling water from the liquid phase of the working fluid $W_L$. More specifically, after the cooling tank 110 is cleaned, a steam $S_G$ and the non-condensable gas $NC_G$ may remain, and the condensate obtained by the condenser 116 during heat exchange would include water and the liquid phase of the working fluid $W_L$. When the condensate returns to the lower volume of the cooling tank 110, because the density of the liquid phase of the working fluid $W_L$ is greater than that of water, the water would be above the liquid phase of the working fluid $W_L$. The liquid phase of the working fluid $W_L$ would flow through the gap below the water baffle 115. In addition, after cleaning, the working fluid recovery device 20 may recover and exhaust the steam $S_G$ in the cooling tank 110 to reduce water residue.

It should be noted that it may be necessary to repair or replace parts of the heat generating component 114 within the cooling tank 110, after the two-phase immersion cooling system 10 has been in operation for a period of time. In the process of repairing or replacing parts, the upper lid 120 would be opened to move the heat generating component 114 up to the closed enclosure 130 in an automatic or semi-automatic manner. When the maintenance or replacement of parts is completed, the upper lid 120 is closed so that the cooling tank 110 remains in a sealed state. As a result, a large amount of vapor phase of the working fluid $W_G$ in the cooling tank 110 would escape into the closed enclosure 130, resulting in the loss of the working fluid. Therefore, the working fluid recovery device 20 of the present disclosure may be used to recover the working fluid 112 in the mixed gas from the closed enclosure 130. To be specific, the valve 183 on the pipeline 182 would be opened to let the mixed gas flow into the working fluid recovery device 20 to recover the working fluid 112, after repairing or replacing parts. The non-condensable gas $NC_G$ not absorbed by the working fluid recovery device 20 would return to the closed enclosure 130 through the pipeline 185.

Figure 2:
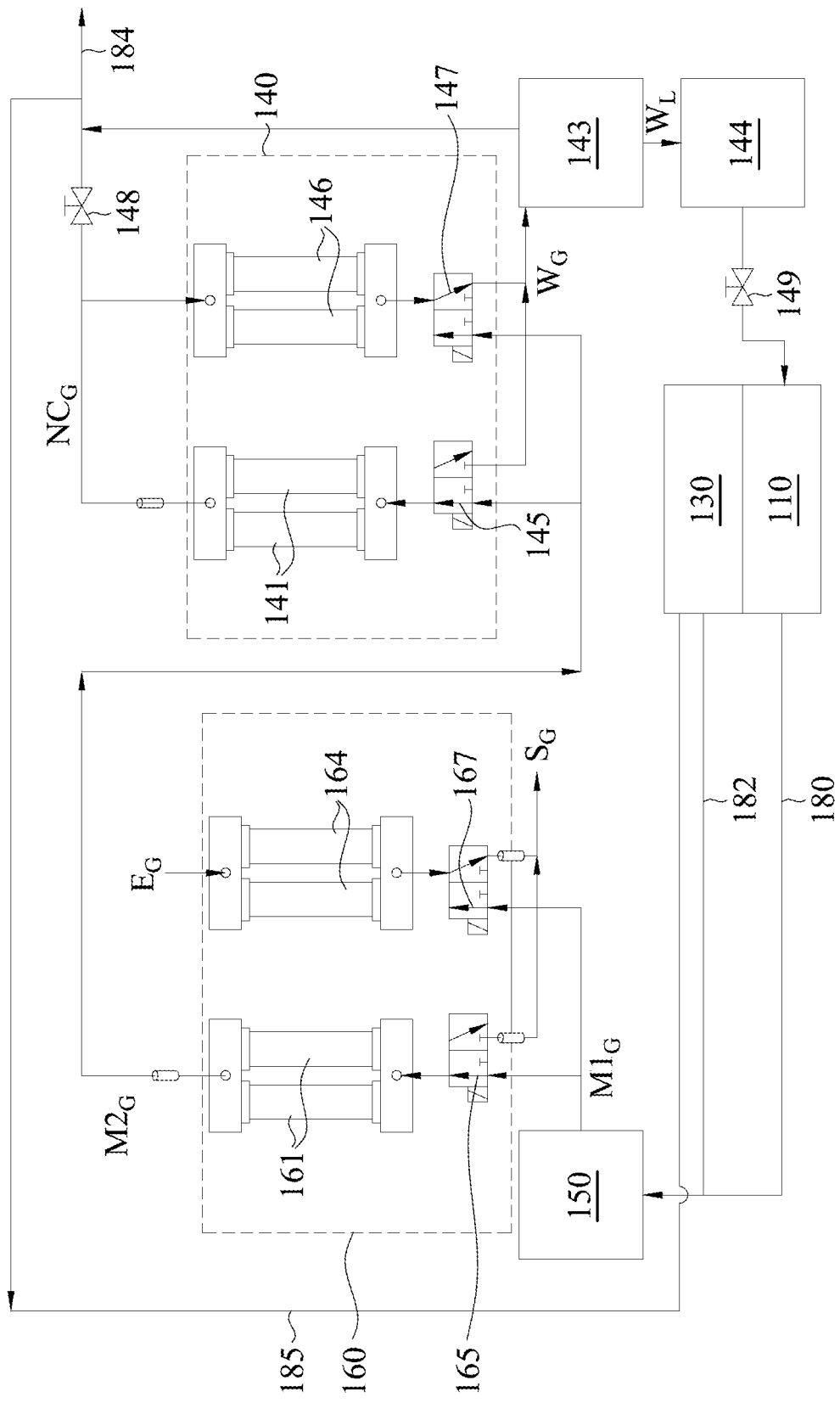
FIG. 2 shows a schematic diagram of the detailed connection relationship between the working fluid recovery device, the cooling tank and the closed enclosure according to an embodiment of the present disclosure.

FIG. 2 shows a schematic diagram of the detailed connection relationship between the working fluid recovery device 20, the cooling tank 110 and the closed enclosure 130 according to an embodiment of the present disclosure. As shown in FIG. 2, the working fluid recovery device 20 includes an air moving unit 150, a water removal unit 160, a working fluid recovery unit 140, a condenser 143, and a working fluid collection tank 144. To be specific, the air moving unit 150 is configured to suck in a mixed gas $M1_G$ including a non-condensable gas $NC_G$, a steam $S_G$, and a vapor phase of the working fluid $W_G$. In some embodiments, the air moving unit 150 may be a gas compressor, a gas pump, and/or a fan, etc. The water removal unit 160 connects to the air moving unit 150 and is configured to remove the steam $S_G$. The working fluid recovery unit 140 connects to the water removal unit 160 and is configured to recover the vapor phase of the working fluid $W_G$. The condenser 143 connects to the working fluid recovery unit 140 and is configured to condense the vapor phase of the working fluid $W_G$ into the liquid phase of the working fluid $W_L$. The working fluid collection tank 144 connects to the condenser 143 and is configured to store the liquid phase of the working fluid $W_L$. The air moving unit 150 communicates with the closed enclosure 130 through the pipeline 182 and communicates with the cooling tank 110 through the pipeline 180.

The water removal unit 160 includes an adsorption unit 161, a desorption unit 164, and solenoid valves 165, 167. The solenoid valve 165 is used to communicate with the air moving unit 150 and the adsorption unit 161 during adsorption, so as to introduce the first mixed gas $M1_G$. The adsorption unit 161 connects to the solenoid valve 165 to absorb steam $S_G$ during adsorption, and exhaust the non-condensable gas $NC_G$ and the vapor phase of the working fluid $W_G$ to the working fluid recovery unit 140. The desorption unit 164 is used to heat up and introduce external air $E_G$ during desorption so as to desorb the steam $S_G$ from the adsorption unit 161. The solenoid valve 167 connects to the desorption unit 164 to exhaust the steam $S_G$ to the outside during desorption.

The working fluid recovery unit 140 includes an adsorption unit 141, a desorption unit 146, and solenoid valves 145, 147. The adsorption unit 141 is used to adsorb vapor phase of the working fluid $W_G$ during adsorption, and exhaust the non-condensable gas $NC_G$. The desorption unit 146 is used to heat up and introduce the non-condensable gas $NC_G$ during desorption, so as to desorb the vapor phase of the working fluid $W_G$ from the adsorption unit 141. The solenoid valve 145 is used to communicate with the adsorption units 161 and 141 during adsorption. The solenoid valve 147 is used to exhaust the vapor phase of the working fluid $W_G$ to the condenser 143 during desorption.

It can be understood that, because the molecules of the vapor phase of the working fluid $W_G$ are larger than the molecules of steam $S_G$, the mixed gas drawn out through the air moving unit 150 should first pass through the water removal unit 160 to absorb smaller molecules of the steam $S_G$, and then pass through the working fluid recovery unit 140 to absorb larger molecules of the vapor phase of the working fluid $W_G$, thereby separating the steam $S_G$ and the vapor phase of the working fluid $W_G$ from the first mixed gas $M1_G$. In some embodiments, the adsorption units 161, 141 and the desorption units 164, 146 include fiber adsorption materials, respectively. Those skilled in the art may select suitable fiber adsorption materials according to the size of gas molecules.

In some embodiments, the working fluid recovery device 20 further includes a valve 148 and a valve 149. The valve 148 connects to the working fluid recovery unit 140 and is used to control the gas in and out between the working fluid recovery unit 140 and the closed enclosure 130 or used to control the gas in and out between the working fluid recovery unit 140 and the outside. The valve 149 connects to the working fluid collection tank 144 and is used to control the liquid phase of the working fluid $W_L$ in and out between the working fluid collection tank 144 and the cooling tank 110.

Figure 3:
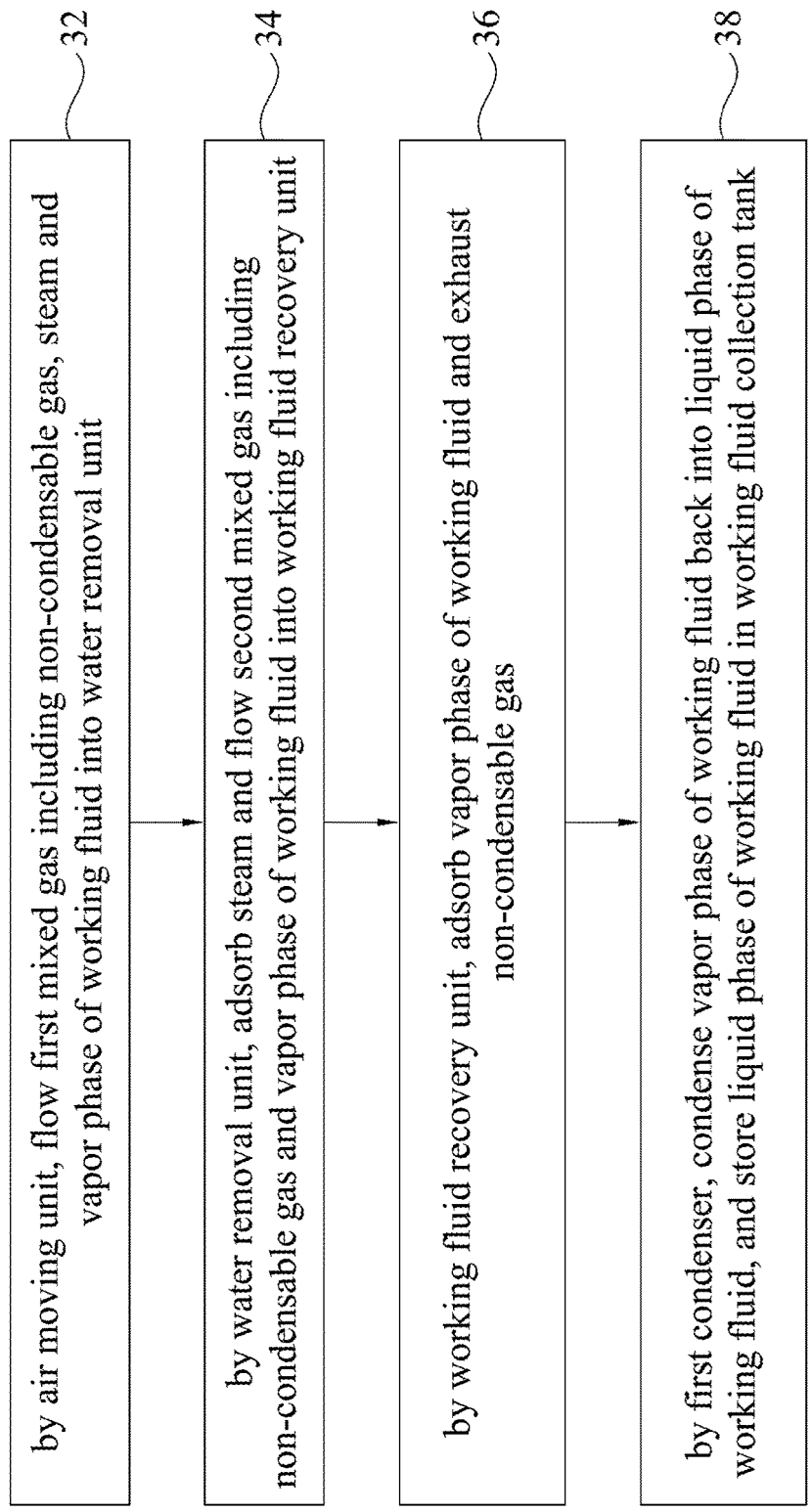
FIG. 3 shows a flowchart of a working fluid recovery method according to an embodiment of the present disclosure.

Regarding the operation of the working fluid recovery device 20, the present disclosure further provides a working fluid recovery method. FIG. 3 shows a flowchart of a working fluid recovery method 30 according to an embodiment of the present disclosure. The working fluid recovery method 30 includes steps 32, 34, 36, and 38.

In the step 32, by the air moving unit 150, flow the first mixed gas $M1_G$ including the non-condensable gas $NC_G$, the steam $S_G$, and the vapor phase of the working fluid $W_G$ into the water removal unit 160. In some embodiments, the first mixed gas $M1_G$ may come from the cooling tank 110 or the closed enclosure 130 of the two-phase immersion cooling system 10.

In the step 34, by the water removal unit 160, adsorb the steam $S_G$ and flow a second mixed gas $M2_G$ including the non-condensable gas $NC_G$ and the vapor phase of the working fluid $W_G$ into the working fluid recovery unit 140.

In the step 36, by the working fluid recovery unit 140, adsorb the vapor phase of the working fluid $W_G$ and exhaust the non-condensable gas $NC_G$. In some embodiments, the non-condensable gas $NC_G$ may be sent back to the closed enclosure 130 to maintain the pressure balance between the closed enclosure 130 and the outside environmental.

In the step 38, by the condenser 143, condense the vapor phase of the working fluid $W_G$ back into the liquid phase of the working fluid $W_L$ and store the liquid phase of the working fluid $W_L$ in the working fluid collection tank 144.

In some embodiments, the working fluid recovery method 30 further includes a step that the working fluid concentration in the closed enclosure 130 is detected by the working fluid sensor 131. When the working fluid concentration is higher than a certain setting threshold, the valve 183 connecting to the closed enclosure 130 is opened to flow the first mixed gas $M1_G$ in the closed enclosure 130 to the working fluid recovery device 20.

In some embodiments, the working fluid recovery method 30 further includes a step that the pressure of the vapor phase of the working fluid $W_G$ in the cooling tank 110 is detected by the manometer 111. When the pressure of the vapor phase of the working fluid $W_G$ is higher than a certain setting threshold, the valve 181 communicating the cooling tank 110 with the working fluid recovery device 20 is opened and the working fluid recovery device 20 is turned on to suck the first mixed gas $M1_G$ in the cooling tank 110.

Please back to FIG. 1. In some embodiments, the two-phase immersion cooling system 10 may further include a bellows 170. To be specific, the bellows 170 is disposed outside the cooling tank 110 and communicates with the cooling tank 110. The bellows 170 is used to passively regulate the pressure in the cooling tank 110. For example, when the pressure in the cooling tank 110 is higher than 0 kPa, the vapor phase in the cooling tank 110 would flow to the bellows 170 to balance the pressure in the cooling tank 110. On the contrary, when the pressure in the cooling tank 110 is lower than 0 kPa, the vapor phase in the bellows 170 would flow to the cooling tank 110 to balance the pressure in the cooling tank 110.

As shown in FIG. 1, the two-phase immersion cooling system 10 further includes a cooling tower 190 communicating with the condenser 116, in some embodiments. The cooling tower 190 provides the cooling water required by the condenser 116. Generally speaking, the cooling water is water at room temperature. To be specific, a first pipeline 192 and a second pipeline 194 are included between the cooling tower 190 and the condenser 116. The first pipeline 192 is used to flow the water from the cooling tower 190 to the condenser 116, and the second pipeline 194 is used to return the heat-exchanged water to the cooling tower 190. One or more sensors 193 may be disposed on the first pipeline 192, such as temperature sensors, flow meters, pressure sensors, and/or other suitable sensors. One or more sensors 193 may also be disposed on the second pipeline 194, such as temperature sensors, flow meters, pressure sensors, water leak detectors and/or other suitable sensors. Moreover, each of the first pipeline 192 and the second pipeline 194 may be provided with a rolling gate valve 196. In some embodiments, a check valve 197 may also be disposed on the second pipeline 194 to avoid backflow of the medium in the pipeline.

In some embodiments, a two-way valve 198 may be disposed on the first pipeline 192, and the two-way valve 198 may be used with the manometer 111 in the cooling tank 110. The two-way valve 198 is controlled by the manometer 111 to turn on or off, thereby realizing connection or disconnection of the cold water in the pipeline. For example, the pressure in the cooling tank 110 is actively controlled by the two-way valve 198 on the first pipeline 192. When the pressure in the cooling tank 110 is higher than 0 kPa, the opening degree of the two-way valve 198 is increased to increase the cooling water flow and improve the cooling capacity of the condenser 116. On the contrary, when the pressure in the cooling tank 110 is lower than 0 kPa, the opening degree of the two-way valve 198 becomes smaller to reduce the flow of cooling water and thereby reduce the cooling capacity of the condenser 116.

In summary, the two-phase immersion cooling system, the working fluid recovery device and the working fluid recovery method of the present disclosure may respectively realize the gas recovery of the cooling tank and the closed enclosure of the two-phase immersion cooling system. The advantages of the present disclosure are that: (1) the working fluid is recovered from the cooling tank and the non-condensable gas and the steam are exhausted to outside, which can improve the circulation efficiency of the working fluid; (2) recycling the gas phase of the working fluid from the closed enclosure may reduce the cost of the gas phase loss of the working fluid and reduce the emission of greenhouse gases.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A working fluid recovery device, comprising:
    a gas moving device configured to suck in a mixed gas comprising a non-condensable gas, a steam and a vapor phase of a working fluid;
    a water removal unit connected to a gas moving device, and configured to remove the steam;
    a working fluid recovery unit connected to the water removal unit, and configured to recover the vapor phase of the working fluid and exhaust the non-condensable gas;
    a first condenser connected to the working fluid recovery unit, and configured to condense the vapor phase of the working fluid into a liquid phase of the working fluid; and
    a working fluid collection tank connected to the first condenser, and configured to store the liquid phase of the working fluid.

2. The working fluid recovery device of claim 1 used in a two-phase immersion cooling system, wherein the working fluid recovery device further comprises:
    a first valve communicated with a cooling tank in the two-phase immersion cooling system; and
    a second valve communicated with a closed enclosure in the two-phase immersion cooling system.

3. The working fluid recovery device of claim 2, further comprising:
    a manometer disposed in the cooling tank of the two-phase immersion cooling system, and used to detect a pressure of the working fluid in the cooling tank,
    wherein, when the pressure is higher than a first threshold, the first valve is opened and the working fluid recovery device is turned on to suck the mixed gas in the cooling tank.

4. The working fluid recovery device of claim 2, further comprising:
    a working fluid sensor disposed in the closed enclosure of the two-phase immersion cooling system, and configured to detect a concentration of the working fluid in the closed enclosure,
    wherein, when the concentration is higher than a second threshold, the second valve is opened and the working fluid recovery device is turned on to suck the mixed gas in the closed enclosure.

5. The working fluid recovery device of claim 1, wherein the water removal unit comprises:
    a first adsorption unit used to adsorb the steam during adsorption and exhaust the non-condensable gas and the vapor phase of the working fluid to the working fluid recovery unit;
    a first desorption unit used to heat up and introduce external air to desorb the steam from the first adsorption unit during desorption;
    a first solenoid valve connected to the first adsorption unit and, configured to communicate a gas moving device with the first adsorption unit during adsorption; and
    a second solenoid valve connected to the first desorption unit, and configured to exhaust the steam during desorption.

6. The working fluid recovery device of claim 5, wherein the working fluid recovery unit comprising:
    a second adsorption unit used to adsorb the vapor phase of the working fluid and exhaust the non-condensable gas during adsorption;

a second desorption unit used to heat up and introduce and the non-condensable gas to desorb the vapor phase of the working fluid from the second adsorption unit during desorption;

a third solenoid valve configured to communicate the first adsorption unit with the second adsorption unit during adsorption; and a fourth solenoid valve configured to exhaust the vapor phase of the working fluid to the first condenser during desorption, wherein the first adsorption unit, the second adsorption unit, the first desorption unit, and the second desorption unit comprise fiber adsorption materials, respectively.

7. The working fluid recovery device of claim 6 used in a two-phase immersion cooling system, further comprising:

a third valve communicated the second adsorption unit and the second desorption unit with a closed enclosure or an outside of the two-phase immersion cooling system; and a fourth valve communicated the working fluid collection tank with a cooling tank of the two-phase immersion cooling system.

8. A two-phase immersion cooling system, comprising:

a cooling tank used to accommodate a working fluid, a heat generating component and a second condenser, wherein, when a liquid phase of the working fluid receives heat from the heat generating component and undergoes phase inversion into a vapor phase of the working fluid, the vapor phase is condensed back to the liquid phase through the second condenser;

an upper lid disposed on a top of the cooling tank;

a closed enclosure disposed above the cooling tank, wherein, when the upper lid is opened, the cooling tank communicates with the closed enclosure, and a portion of the vapor phase of the working fluid escapes into the closed enclosure; and a working fluid recovery device of claim 1 disposed outside of the cooling tank and the closed enclosure, communicated with the cooling tank and the closed enclosure, and used to recover the vapor phase of the working fluid escaping into the closed enclosure.

9. The two-phase immersion cooling system of claim 8, further comprising a cooling tower communicating with the second condenser.

10. The two-phase immersion cooling system of claim 9, further comprising a first pipeline and a second pipeline between the cooling tower and the second condenser, wherein the first pipeline is used to flow water from the cooling tower to the second condenser.

11. The two-phase immersion cooling system of claim 10, further comprising a two-way valve disposed on the first pipeline, wherein the two-way valve is used to actively a pressure in the cooling tank.

12. The two-phase immersion cooling system of claim 8, further comprising a bellows disposed outside the cooling tank and communicating with the cooling tank, wherein the bellows is used to passively regulate a pressure in the cooling tank.

13. A working fluid recovery method used in the working fluid recovery device of claim 1, comprising:

by a gas moving device, flowing a first mixed gas comprising a non-condensable gas, a steam and a vapor phase of a working fluid into a water removal unit;

by the water removal unit, adsorbing the steam and flowing a second mixed gas comprising the non-condensable gas and the vapor phase of the working fluid into a working fluid recovery unit;

by the working fluid recovery unit, adsorbing the vapor phase of the working fluid and exhaust the non-condensable gas; and by the first condenser, condensing the vapor phase of the working fluid back into a liquid phase of the working fluid, wherein the liquid phase of the working fluid is stored in a working fluid collection tank.

14. The working fluid recovery method of claim 13, further comprising:

by a manometer disposed in the cooling tank in a two-phase immersion cooling system, detecting a pressure of the vapor phase of the working fluid in a cooling tank, wherein when the pressure is higher than a first threshold, a first valve communicating the cooling tank with the working fluid recovery device is opened and the working fluid recovery device is turned on to suck the first mixed gas in the cooling tank.

15. The working fluid recovery method of claim 13, further comprising:

by a working fluid sensor disposed in the closed enclosure in a two-phase immersion cooling system, detecting a concentration of the vapor phase of the working fluid in a closed enclosure, wherein when the concentration is higher than a second threshold, a second valve communicating the closed enclosure with the working fluid recovery device and the working fluid recovery device are opened to suck the first mixed gas in the closed enclosure.

* * * * *